US007242266B2

(12) United States Patent
Peterson

(10) Patent No.: US 7,242,266 B2
(45) Date of Patent: Jul. 10, 2007

(54) DISTRIBUTED INTERCONNECT

(75) Inventor: Kent E. Peterson, Hoffman Estates, IL (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 10/662,779

(22) Filed: Sep. 15, 2003

(65) Prior Publication Data

US 2005/0057321 A1 Mar. 17, 2005

(51) Int. Cl.
*H03H 7/38* (2006.01)

(52) U.S. Cl. ........................................ 333/34; 333/260

(58) Field of Classification Search .................. 333/34, 333/260, 246, 247, 33
See application file for complete search history.

(56) References Cited

U.S. PATENT DOCUMENTS 3,593,174 A * 7/1971 White ........................ 330/286
4,092,616 A * 5/1978 Osterwalder ................ 333/125

OTHER PUBLICATIONS

Ginzton et al. "Distributed Amplification" Proceedings of the I.R.E. v. 36, pp. 956-969, (1948).
Russell. "Microwave Power Combining Techniques" IEEE Transactions on Microwave Theory and Techniques, vol. MTT-27, pp. 472-478, May 1979.
Nelson et al. "Optimum Microstrip Interconnections" IEEE MTT-S Digest, pp. 1071-1074 (1991).
Fano. "Theoretical Limitations on the Broadband Matching of Arbitrary Impedances" Journal of the Franklin Institute, vol. 249, pp. 57-83 (Jan. 1950) pp. 139-155 (Jan. 1960).

* cited by examiner

*Primary Examiner*—Stephen E. Jones
(74) *Attorney, Agent, or Firm*—Stetina Brunda Garred & Brucker

(57) ABSTRACT

A distributed interconnect and a method is provided for interconnecting electrical components which minimizes coupling inductance and increases bandwidth. The interconnect includes a transmission line with a first and second conductive transmission element. The first conductive transmission element is disposed between a first and second terminal, and has an impedance characteristic that increases from the first terminal to the second terminal. The second conductive transmission element is disposed between a third and fourth terminal, and has an impedance characteristic that increases from the third terminal to said fourth terminal. The conductive transmission elements are furthermore positioned in parallel alignment with respect to each other. A plurality of conductive interconnect elements interconnect the first and second transmission elements and are distributed along the first and second transmission elements and at least interconnect the first terminal to the fourth terminal and interconnect the second terminal to the third terminal. Furthermore, a first port is connected to the first terminal and a second port is connected to a third terminal.

27 Claims, 6 Drawing Sheets

DISTRIBUTED INTERCONNECT

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates to interconnections between electrical components. In particular, the present invention relates to interconnections and methods that may be utilized to overcome the negative impact of high inductance indigenous to interconnections (such as bondwires or vias through substrates) between components utilized in microwaves applications.

2. Background of the Invention

An important consideration in microwave design engineering is dealing with unwanted inductance. Inductance becomes increasingly common as the frequency of an alternating current increases. At microwave frequencies, this phenomenon becomes a major consideration in the design of electronic equipment. Any length of wire has some inductance. As with a transmission line, the inductance of a wire increases as the frequency increases. Wire inductance is therefore more significant at microwave frequencies than at lower frequencies. As a result, in microwave applications the frequency of any circuit can be altered by inductance, degrading the performance of the equipment.

Typically, individual microwave components are usually connected together by mounting the components with epoxy or by soldering them onto metal traces on a substrate. For larger systems, metal traces on one substrate must be connected to the metal traces on another substrate. A common way of accomplishing this is with small bondwires, bonded (either with an ultrasonic scrub or with thermo-compression) from a metal trace on one substrate, over a gap, to a metal trace on another substrate. The wirebond is typically 1 mil (0.001 inch) in diameter, and may be anywhere from about 10 mils to 50 or even 100 mils or more in length. While 0.10 seems minimal, it can be an appreciable fraction of a wavelength. For example, at 10 GHz, a wavelength is about an inch which means the bondwire can be about 1/10 of a wavelength long. This can have a serious negative impact on the fidelity of a microwave signal.

Usual methods of dealing with high bondwire inductance include: (1) making the bondwires shorter; (2) arranging a plurality of bondwires in parallel; and/or (3) “matching” the inductance of the bondwire by resonating it with a small capacitance. Limitations to each of these approaches exist. Bondwire length typically must be at least a certain length for mechanical reasons, such as allowing for thermal expansion and contraction of the substrates. Arranging wires in parallel is limited by the mutual coupling that inevitably exists between wires if they are close together, and by other effects if the wires are spread out too much. Resonating or matching the bondwires is limited to achieving a certain amount of bandwidth.

There have been numerous research studies which have pertained to controlling inductance in transmission lines. For example, there is known a “distributed amplifier” which distributes capacitance across a transmission line to produce an amplifier with greater bandwidth, which is described in an abstract by Ginzton et. al., (“Distributed Amplification”, Proc. I.R.E., v. 36, pp. 956–969, 1948). The canonical approach for the distributed amplifier is to use a constant impedance transmission line for the input and output. However, the distributed amplifier is concerned with distributing capacitance, rather than inductance. Furthermore, the distributed amplifier utilizes amplifying elements and transmission line terminations.

Another reference is the microwave circuit configuration known as a “traveling wave power divider/combiner.” It is also sometimes called a “chain” combiner (Russell, Kenneth J., “Microwave Power Combining Techniques”, IEEE Trans. on MTT, vol. MTT-27, pp 472–478, May 1979). This approach varies the impedance of a transmission line as a portion of the energy is sent in a different direction. However, this design is based on an assumption that each energy tap of the traveling wave power divider is expected to have a good impedance match, not a high inductance. Moreover, each tap is separated from the next by a nominal 90 electrical degrees which can be prohibitively larger for many applications. Also, in this approach, isolation resistors are typically used for the traveling wave power divider.

Another technique involves matching the interconnect inductance with shunt capacitance. This technique addresses the same performance issues by simply providing paralleled inductances and matched elements applied to either end. This approach was published by Nelson, Steve, Marilyn Youngblood, Jeanne Pavia, Brad Larson, and Rick Kottman, “Optimum Microstrip Interconnects, 1991 IEEE MTT-S Digest, pp 1071–1074. This method for dealing with unwanted inductance has been shown to be effective, but, at a substantial cost of bandwidth.

Moreover, the performance limitations produced by individual interconnects were examined in some detail by R. M. Fano in his paper “Theoretical limitations on the broadband matching of arbitrary impedances,” published in the Journal of the Franklin Institute, vol. 249, Jan. 1950 pp 57–83 and Feb. pp 139–155. Nevertheless, the aforementioned references still do not teach or suggest a solution towards overcoming microwave application interconnections having high inductances.

It would be advantageous and desirable to provide an interconnect and method of interconnected components which overcome the negative impact of high inductance indigenous to interconnection elements utilized in microwave applications. Moreover, it would be beneficial to provide an interconnect that can be cost-effectively manufactured while delivering optimal performance.

BRIEF SUMMARY OF THE INVENTION

The present invention is intended to overcome and solve the aforementioned problems commonly encountered in the production of microwave hardware. Furthermore, the present invention provides better performance characteristics than any previously known or published approaches.

The present invention is a device and method utilized to connect two components together using interconnect elements that have high inductance characteristics, by distributing the elements along a transmission line, instead of only paralleling them. Simply paralleling two high inductance interconnects has been shown to offer limited microwave performance, since the interconnects are required to be close together by unrelated circuit limitations, such as manufacturing guidelines. The mutual inductance between elements ultimately limits the performance of the parallel approach. On the other hand, the distributed interconnect technique may use the same high inductance individual interconnects, but now distributes them across a transmission line, which may have tapered or stepped impedance characteristics. As a result, the distributed interconnect approach neatly side-steps previously proven bandwidth limitations for parasitic impedances and allows for a wide-band high performance interconnect.

According to the present invention, a distributed interconnect is provided for interconnecting electrical components which minimizes coupling inductance and increases bandwidth. The distributed interconnect includes a transmission line with a first and second conductive transmission element. The first conductive transmission element is disposed between a first and second terminal, and has an impedance characteristic that increases from the first terminal to the second terminal. The second conductive transmission element is disposed between a third and fourth terminal, and has an impedance characteristic that increases from the third terminal to said fourth terminal. The first and second conductive transmission elements are furthermore positioned in parallel alignment with respect to each other. The interconnect also includes a plurality of conductive interconnect elements interconnecting the first and second transmission elements. The plurality of interconnect elements are distributed along the first and second transmission elements and at least interconnect the first terminal to the fourth terminal and interconnect the second terminal to the third terminal. Furthermore, a first port is connected to the first terminal and a second port is connected to a third terminal.

According to an aspect of the present invention, the plurality of conductive interconnect elements includes at least one interconnect element evenly distributed between the first and second terminal and evenly distributed between the third and fourth terminal. In another aspect of the present invention, the impedance characteristic of the first and second conductive elements increases in one of a stepped, tapered and linear manner. Another aspect of the present invention includes the plurality of conductive interconnect elements being positioned normal to the first and second transmission elements and in parallel with each other. And according to another aspect of the present invention, the plurality of conductive interconnect elements are evenly spaced from each other.

Another embodiment of the present invention is provided in which the first conductive transmission element includes a first metal trace disposed on a first surface and along a first edge of a first substrate. The second conductive transmission element includes a second metal trace disposed on a second surface and along a second edge of a second substrate. Also, the first edges and second edges are laterally positioned next to each other forming a parallel gap therebetween. Moreover, another aspect of the instant embodiment includes the plurality of conductive interconnect elements comprising equally spaced bondwires spanning the gap in a laterally parallel and equally space configuration. And yet another aspect of the instant embodiment includes the first and second traces having one of a tapered and stepped shape.

According to another embodiment of the present invention, a bilateral trace is electrically connected to an upper side of the first and second traces, wherein the first and second traces have one of a dual stepped and dual tapered shape.

And yet another embodiment of the present invention includes the first conductive transmission element having a first metal trace disposed on an upper surface of a substrate, and the second conductive transmission element having a second metal trace disposed on a lower surface of said substrate. Also, the first and second traces are partially positioned above one another in a parallel orientation. According to an aspect of the instant embodiment, the plurality of conductive interconnect elements includes a plurality of one of metal filled and edge plated vias disposed through the upper and lower surface of the substrate. And yet another aspect of the instant embodiment includes the first and second metal traces having one of a tapered, stepped, dual tapered, and dual stepped configuration.

Additionally, another embodiment of the present invention is provided in which the first conductive transmission element includes a first lead connected to a device disposed internally in a semiconductor package, and the second conductive transmission element having a second lead externally disposed on a surface of a substrate. And according to an aspect of the instant embodiment, the plurality of conductive interconnect elements includes a plurality of one of metal filled and edge plated vias disposed internally in the semiconductor package. Moreover, an aspect of the instant embodiment includes a respective plurality of terminal leads exiting the package, wherein the terminal leads have an internal end and an external end, and wherein the plurality of vias are bonded to each respective terminal lead, and the external leads are bonded to the second lead. Additionally, the first and second lead having a pillar shape in which pads of equal area are provided for each interconnect element and pillar portions interconnect the pads, and wherein a width of the pillar portions are incrementally decreased from the first terminal to the second terminal and from the third terminal to the fourth terminal. Another aspect of the instant embodiment is that the first and second lead have one of a tapered and/or stepped shape.

Additionally, another aspect of the present invention is a method for interconnecting electrical components which minimizes coupling inductance and increases bandwidth. The method includes establishing a transmission line which includes disposing a first conductive transmission element between a first and second terminal, the first conductive element having an impedance characteristic that increases from the first terminal to the second terminal; disposing a second conductive transmission element between a third and fourth terminal, the second conductive element having an impedance characteristic that increases from said third terminal to the fourth terminal; and positioning the first and second conductive elements in parallel alignment with respect to each other. The method also includes interconnecting a plurality of conductive interconnect elements between the first and second transmission elements by distributing the plurality of interconnect elements along the first and second transmission elements, at least interconnecting the first terminal to the fourth terminal, and at least interconnecting the second terminal to the to the third terminal. The method also includes electrically connecting a first port to the first terminal, and electrically connecting a second port to the third terminal.

Another aspect of the method of the present invention may include evenly distributing the plurality of conductive interconnect elements between the first and second terminal and between the third and fourth terminal. Another aspect of the instant invention may include increasing the impedance characteristic of the first and second conductive elements in one of a stepped, tapered and linear manner. An additional aspect may include positioning the plurality of conductive interconnect elements normal to the first and second transmission elements and in a lateral and parallel orientation with respect to each other.

Another aspect of the method of the present invention may include forming the first conductive transmission element from a first metal trace, disposing the first metal trace on a first surface and along a first edge of a first substrate, forming the second conductive transmission element from a second metal trace, disposing the second metal trace on a second surface and along a second edge of a second substrate, and positioning the first edges and second edges laterally next to each other to form a parallel gap therebetween. Also the method may include utilizing equally spaced bondwires spanning the parallel gap as the plurality of conductive interconnect elements. The method may also include providing first and second traces which have one of a tapered and stepped shape.

Moreover, an aspect of the present invention may include electrically connecting a bilateral trace to an upper side of the first and second traces, wherein the first and second traces have one of a dual stepped and dual tapered shape. The method may further include forming the first conductive transmission element from a first metal trace, disposing the first metal trace on an upper surface of a substrate, forming the second conductive transmission element from a second metal trace, disposing the second metal trace on an upper surface of a substrate, and positioning the first and second traces partially above one another in a parallel orientation. Also, the method may include utilizing at least one of a metal filled or edge plated via disposed through the upper and lower surface of the substrate as the plurality of conductive interconnect elements. Furthermore, the method may include providing first and second metal traces having one of a tapered, stepped, dual tapered, or dual stepped configuration.

Furthermore, an aspect of the instant method may include utilizing a first lead connected to a device disposed internally in a semiconductor package as the first conductive transmission element, and utilizing a second lead externally disposed on a surface of a substrate as the second conductive transmission element. Also the method may include utilizing at least one of a metal filled and edge plated via disposed internally in the semiconductor package as the plurality of conductive interconnect elements interconnecting the first and second conductive leads. Another aspect of the method may include utilizing a respective plurality of terminal leads for exiting the package, wherein the terminal leads have an internal end and an external end, electrically connecting at least one via to each respective terminal lead, and electrically connecting the external leads to the second lead. Additionally, the method may include providing a first and second lead having a stacked pillar shape or rectangular cross-section in which pads of equal area are provided for each interconnect element and pillar portions interconnect the pads, and wherein a width of the pillar portions are incrementally decreased from said first terminal to said second terminal and from said third terminal to said fourth terminal.

Other exemplary embodiments and advantages of the present invention may be ascertained by reviewing the present disclosure and the accompanying drawings.

BRIEF DESCRIPTION OF THE DRAWINGS

The present invention is further described in the detailed description that follows, by reference to the noted drawings by way of non-limiting examples of preferred embodiments of the present invention, in which like reference numerals represent similar parts throughout several views of the drawings, and in which.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Prior Art Description

Figure 1:
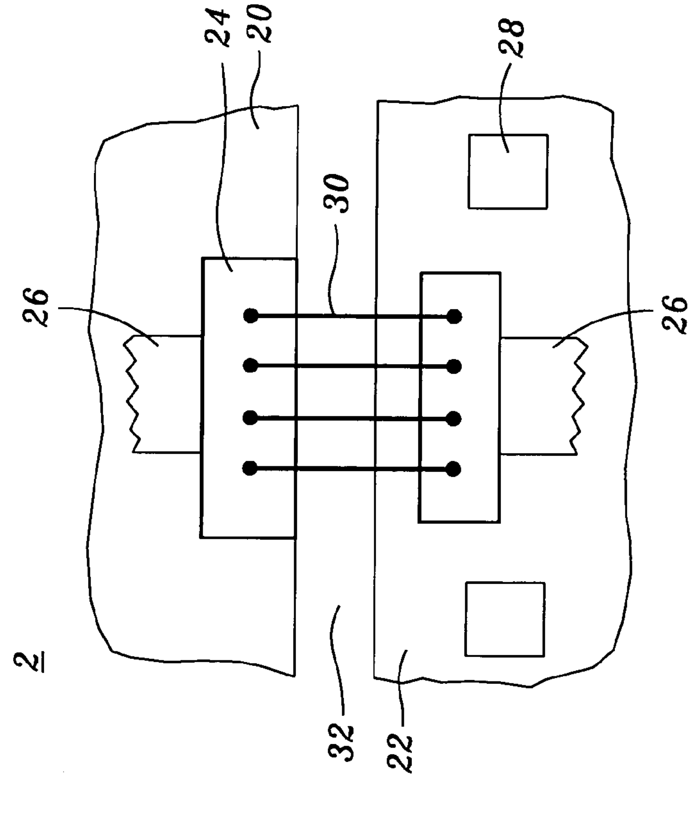
FIG. 1 (PRIOR ART)
FIG. 1 is an illustration of an exemplary prior art interconnect device which utilizes parallel interconnects.

FIG. 1 is an illustration of a prior art parallel interconnect device 2 which utilizes parallel interconnects 30. In particular, a plurality of bondwires 30 are interconnected between a first rectangular metal trace 24 on the top surface of a first substrate 20 to a second rectangular metal trace 26 on a second substrate 22. The small squares 28 laterally oriented to the sides of the second metal trace 26 may be connected with other wires to add capacitance to the interconnect device 2 if needed. The prior art parallel interconnect device 2 utilizes a couple of known standard approaches to overcoming interconnect inductance: (1) paralleling several bondwires 30, and (2) matching or resonating the inductance with capacitive matching elements. The gap 16 between substrates 20, 22 must be at least a specified distance apart to prevent epoxy from being pushed up between the substrates 20, 22, which could short circuit the parallel interconnect 2. Moreover, the bondwires 30 must be separated by an equal distance to minimize mutual inductance and to provide proper clearance for a machine that attaches the bondwires 30 to traces 24, 26.

Distributed Interconnect Utilizing a Tapered Trace (First Embodiment)

Figure 2:
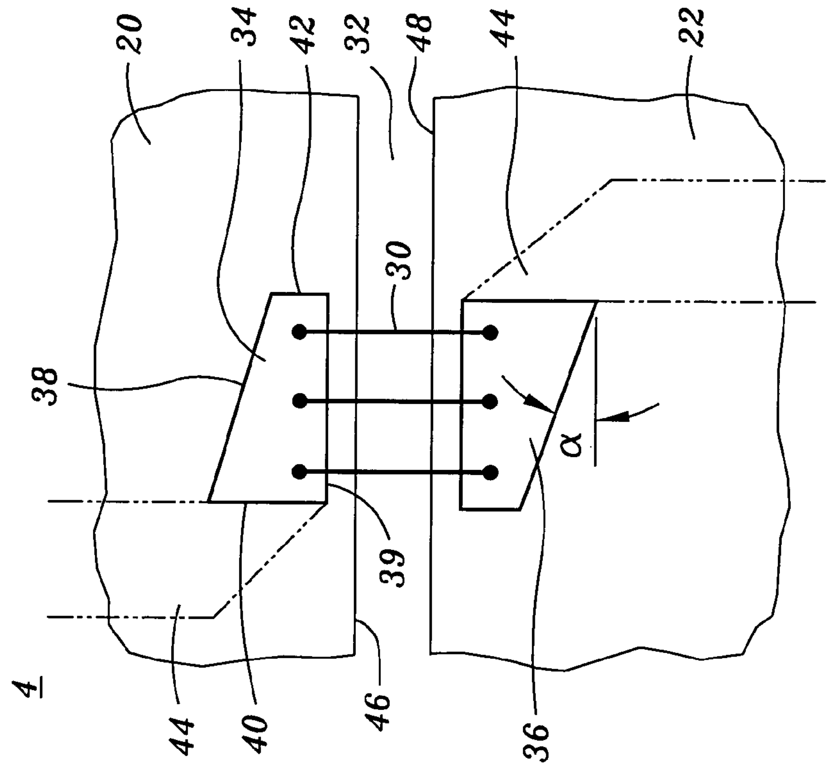
FIG. 2 is an illustration of a first exemplary embodiment of the present invention which is a distributed interconnect utilizing a pair of opposing tapered traces.

FIG. 2 is an illustration of a first exemplary embodiment of the present invention which is a distributed interconnect 4 utilizing and a pair of opposing tapered traces 34, 36. The first exemplary embodiment utilizes a first tapered metal trace 34 disposed on the upper surface of a first substrate 20, and a second tapered metal trace 36 disposed on the upper surface of a second substrate 22. The first substrate 20 is provided with a first generally straight edge 46 positioned next to the second substrate 22 having a second generally straight edge 48 such that the first and second substrates 20, 22 form a parallel gap 32 there between. The first trace 34 has a tapered shape. In particular, the first trace 34 has a base side 39 laterally spaced and parallel to said first generally straight edge 46, a short side 42 and tall side 40 oriented normal to said base side 39 and a tapered or inclined side 38 connecting the short and tall side 42, 40 and opposing the base side 39. The angle of inclination of the taper side 38 is defined by a degrees. Similarly, the second substrate 22 is provided having a second trace 36 with the same tapered shape as the first trace 34 oriented in a similar position on the second substrate 22. It is noted that the shape of the first and second trace 34, 36 utilized in the instant embodiment may vary depending on the application, and therefore, the distributed interconnect 4 should not be limited only to FIG. 2. A plurality of bondwires 30 interconnect the first and second traces 34, 36. It is further noted that the number of interconnects 30 utilized in the instant embodiment and all other embodiments of the present invention. Preferably, the interconnects 30 are equally spaced apart and of equal length for the instant embodiment and all other embodiments of the present invention. A pair of forty-five degree chamfered traces 44, which act as the ports for the distributed interconnect 4, are positioned laterally next to and electrically connected to each tall side 40 of metal traces 34, 36.

Distributed Interconnect Utilizing a Stepped Trace (Second Embodiment)

Figure 3:
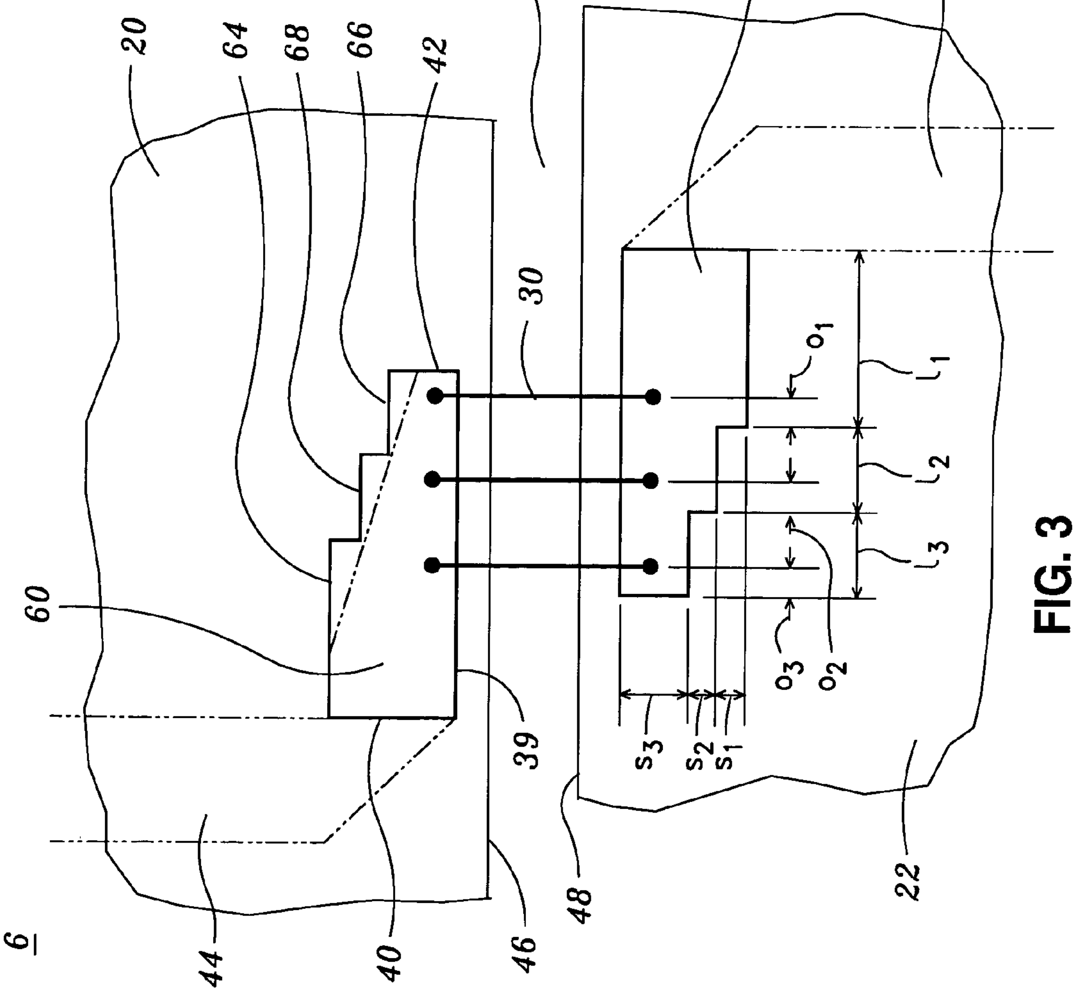
FIG. 3 is an illustration of a second exemplary embodiment of the present invention which is a distributed interconnect utilizing a pair of opposing stepped traces.

FIG. 3 is an illustration of a second exemplary embodiment of the present invention which is a distributed interconnect 6 utilizes a pair of opposing stepped traces 60, 62. The first stepped trace 60 is disposed on the upper surface of a first substrate 20 and the second tapered trace 62 is disposed on the upper surface of a second substrate 22. The first substrate 20 is provided with a first generally straight edge 46 positioned next to the second substrate 22 having a second generally straight edge 48 such that the first and second substrates 20, 22 form a parallel gap 32 there between. The first trace 60 has a stepped shape. In particular, the first trace 60 has a base side 39 laterally spaced and parallel to said first generally straight edge 46, a short side 42 and tall side 40 oriented normal to said base side 39 and a stepped side 64 with downwardly proceeding steps connecting the short and tall side 42, 40 and opposing the base side 39. Similarly, the second substrate 22 is provided having a second trace 62 with the same stepped shape as the first trace 60 oriented in a similar position on the second substrate 22. The shape of the stepped trace 60, 62 may be embodied in a variety of forms. The instant embodiment illustrated in FIG. 3, includes three step height measurements $s_1$, $s_2$, $s_3$ and three step length measurements $l_1$, $l_2$, $l_3$. Note that the length at which the step occurs is dependent on offset measurements $o_1$, $o_2$, $o_3$ taken from a spacing centerline of each interconnect 30. Preferably, the stepped side 64 has one less step 66 than the number of interconnects 30 utilized on the device. For example, the embodiment shown in FIG. 3 utilizes three interconnects 30, and therefore, two steps 60 are utilized. It is noted that the shape of the first and second trace 60, 62 utilized in the instant embodiment may vary depending on the application, and therefore, the distributed interconnect 6 should not be limited to FIG. 3. Moreover, an alternative embodiment of a tapered trace having an inclined side 68 is shown in FIG. 3 (shown in phantom lines).

Model of First and Second Exemplary Embodiments

Figure 4:
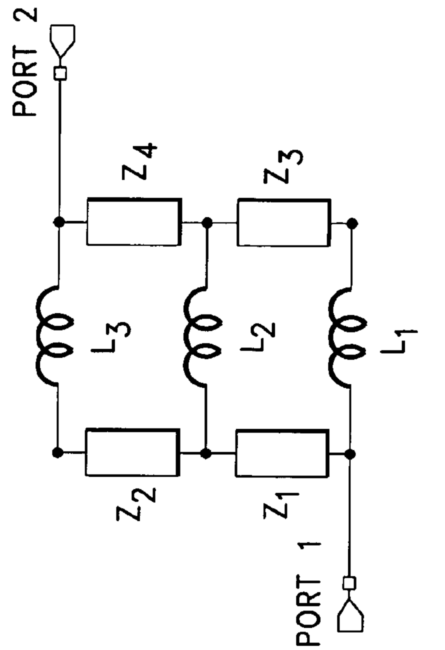
FIG. 4 is an electrical schematic which models the first and second exemplary embodiments shown in FIGS. 2 and 3, according to an aspect of the present invention.

FIG. 4 is an electrical schematic which models the first and second exemplary embodiments shown in FIGS. 2 and 3, according to an aspect of the present invention. In particular, the first and second embodiment of the distributed interconnect device 4, 6 may be modeled as having a transmission line with characteristic impedances $Z_1$, $Z_2$, $Z_3$ and $Z_4$ with respective electrical lengths. It is noted that $Z_2>Z_1$ and $Z_3>Z_4$, which simulates the "tapered" or "stepped" transmission line feature. Inductances $L_1$, $L_2$ and $L_3$, which simulate the bondwires having equal inductive characteristics (i.e., $L_1=L_2=L_3$), are distributed along the transmission line. As a result of the following transmission line circuit, inductances $L_1$, $L_2$ and $L_3$ are far enough apart to minimize mutual inductance. Ports 1 and 2 are considered the input/output ports of the device 4, 6.

Distributed Interconnect Utilizing a Tapered Trace (Third Embodiment)

Figure 5:
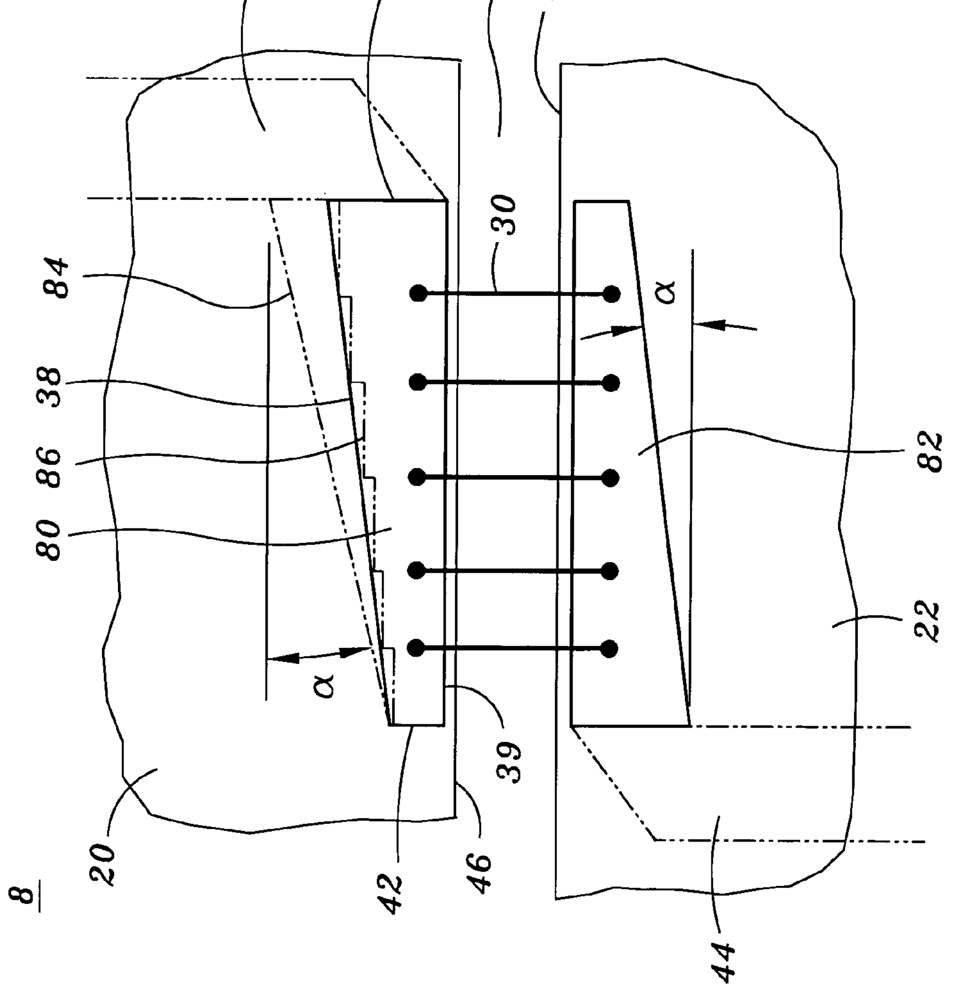
FIG. 5 is an illustration of a third exemplary embodiment of the present invention which is a distributed interconnect with five interconnects and a pair of opposing tapered traces.

FIG. 5 is an illustration of a third exemplary embodiment of the present invention which is a distributed interconnect 8 with a plurality of interconnects 30 and a pair of opposing tapered traces 80, 82. The third embodiment is a variant to the first embodiment, and therefore, a detailed explanation is not provided. The instant embodiment is provided to illustrate that the present invention may have a variety of shapes and sizes depending on the specific distributed interconnect application. For example, the third embodiment utilizes tapered traces 80, 82 which are adapted for five interconnects 30. However, the angle of inclination of the taper side 38 defined by $\alpha$, may be adjusted up or down to induce desired characteristics within the distributed interconnect. For instance, an alternative inclined side 84 (shown in phantom lines) may be utilized which has a steeper angle of inclination $\alpha$. Moreover, in the alternative, the same embodiment could utilize a stepped side 86 (shown in phantom lines) instead of the tapered or inclined side 38.

Model of Third Exemplary Embodiment

Figure 6:
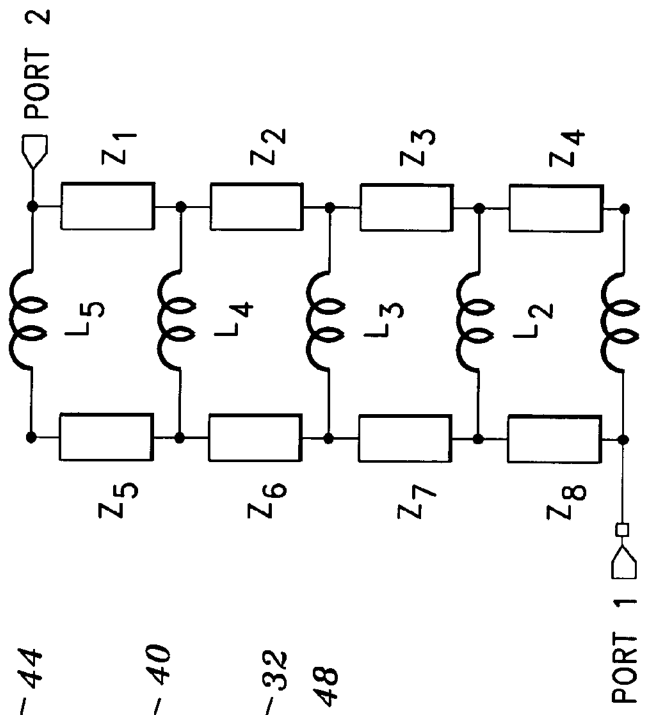
FIG. 6 is an electrical schematic which models the third exemplary embodiment shown in FIG. 5, according to an aspect of the present invention.

FIG. 6 is an electrical schematic which models the third exemplary embodiment shown in FIG. 5, according to an aspect of the present invention. The instant embodiment may be modeled by a transmission line featuring eight characteristic impedances $Z_1$ through $Z_8$ with respective electrical lengths. Note the metal traces are arranged such resulting characteristic impedances have the following relationships: $Z_5>Z_6>Z_7>Z_8$ and $Z_4>Z_3>Z_2>Z_1$, which define the "tapered" or "stepped"transmission line. It is also noted that $Z_5=Z_4$, $Z_6=Z_3$, $Z_7=Z_2$, $Z_8=Z_1$. Furthermore, inductances $L_1$ through $L_5$, which represent equivalent bondwire inductances (i.e., $L_1$ through $L_5$ being equal) are distributed along the transmission line. Ports 1 and 2 are considered the input/output ports of the device 8.

Bilaterally Configured Distributed Interconnect (Fourth Embodiment)

Figure 7:
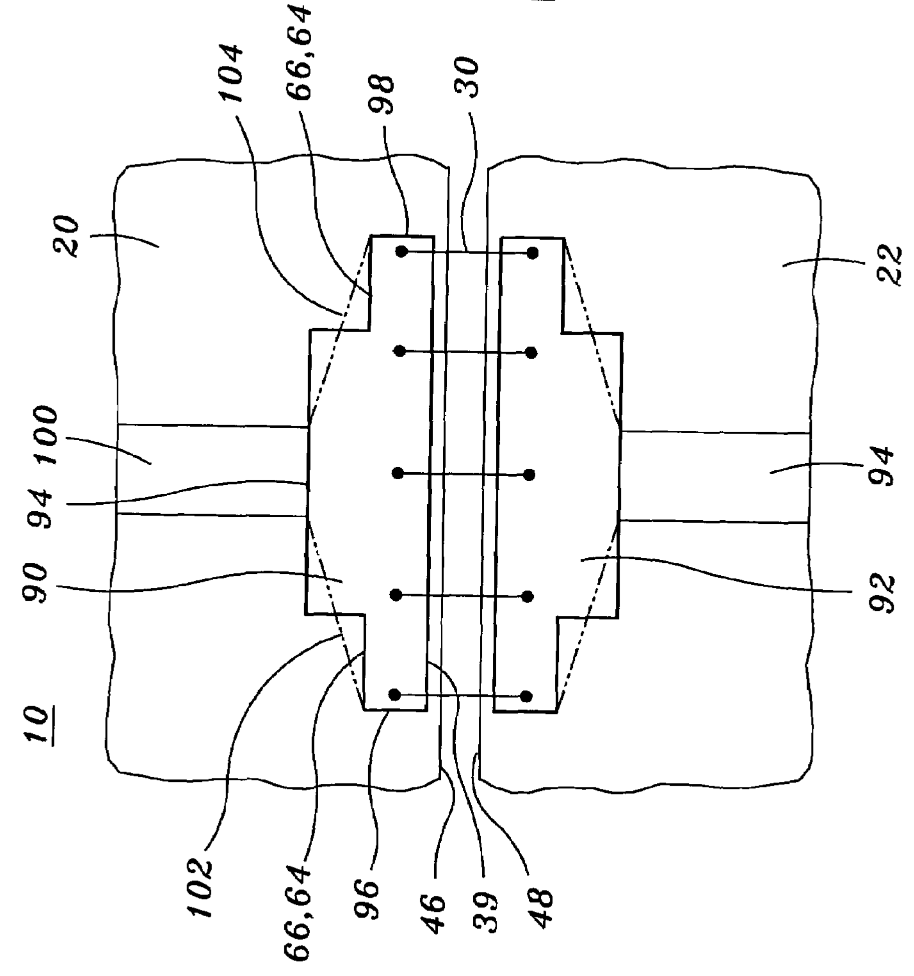
FIG. 7 is an illustration of a fourth exemplary embodiment of the present invention which is a bilateral distributed interconnect with five interconnects and a pair of opposing dual-stepped traces.

FIG. 7 is an illustration of a fourth exemplary embodiment of the present invention which is a bilateral distributed interconnect 10 having a plurality of interconnects 30 and a pair of opposing dual stepped traces 90, 92. A difference in the fourth embodiment, is the utilization of a bilateral trace 94 which is connected to the upper side 100 of traces 90, 92. Also, the dual stepped traces 90, 92 have steps 66 on both sides of the trace 90, 92. Another embodiment would utilize a dual tapered shape having a tapered left side 102 and a tapered right side 104 (shown in phantom lines), instead of steps 66. In particular, the dual stepped traces 90, 92 have a base side 39 laterally spaced and parallel to said first generally straight edge 46 or 48, a left side 96 and right side 98 oriented normal to said base side 39, an upper side 100, and a pair of stepped sides 64 connecting the left and right side 96, 98 to the upper side 100. It is noted that the shape of the first and second dual stepped traces 90, 92 utilized in the instant embodiment may vary depending on the application, and therefore, the bilateral distributed interconnect 10 should not be limited to FIG. 7. The utilization of the bilateral trace 94 provides a performance equivalent to the other embodiments, yet, the orientation of the bilateral trace 94 allows for better access and ease of use.

Model of Fourth Exemplary Embodiment

Figure 8:
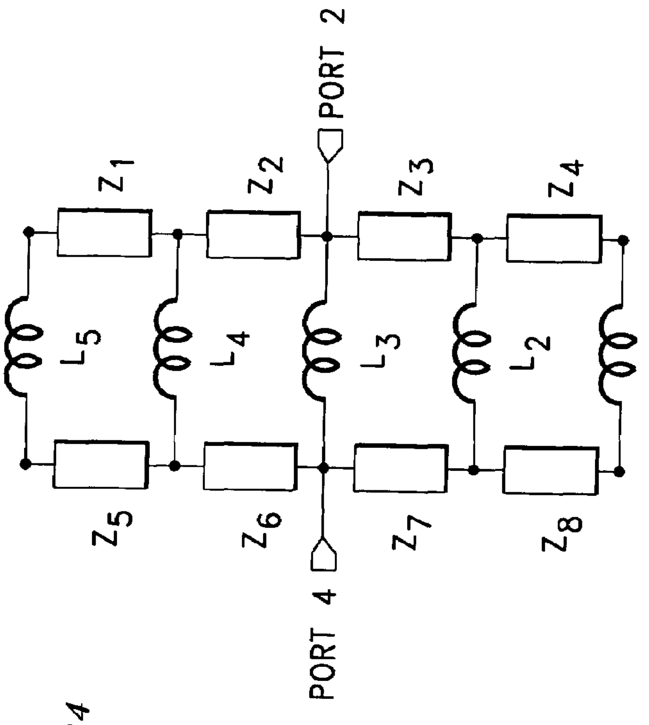
FIG. 8 is an electrical schematic which models the fourth exemplary embodiment shown in FIG. 7, according to an aspect of the present invention.

FIG. 8 is an electrical schematic which models the fourth exemplary embodiment shown in FIG. 7, according to an aspect of the present invention. The instant embodiment may be modeled by a transmission line featuring eight characteristic impedances $Z_1$ through $Z_8$ with respective electrical lengths. Note the metal traces are arranged such resulting characteristic impedances have the following relationships: $Z_8>Z_7$, $Z_5>Z_6$, $Z_1>Z_2$, $Z_4>Z_3$, which define the "dual-stepped" or "dual tapered" transmission line. It is also noted that $Z_2=Z_3=Z_6=Z_7$ and $Z_1=Z_4=Z_5=Z_8$. Furthermore, inductances $L_1$ through $L_5$, which represent equivalent bondwire inductances (i.e., $L_1$ through $L_5$ being equal), are distributed along the transmission line. Ports 1 and 2 are considered the input/output ports of the device 10. Port 1 is connected to a node which is common between $Z_6$, $Z_7$ and $L_1$. Port 2 is connected to a node which is common between $Z_2$, $Z_3$ and $L_3$.

Distributed Interconnect For Through-substrate Connections (Fifth Embodiment)

It should be noted that the present invention is not be limited to the aforementioned embodiments discussed. Even though the present invention may be configured to connect signals from one substrate to another, additional applications are apparent, as the present invention may be utilized anywhere there are limitations posed by circuit inductance.

For instance, through-substrate via holes are frequently limited to a certain inductance by fabrication limitations. Using a number of through-substrate via holes in a row, with a tapered transmission line on each level connecting to the vias allows multi-layer microwave circuits to be realized with higher performance than previously possible given the present fabrication limitations. In such a high inductance environment, a distributed interconnect may be utilized to minimize the negative impact of inductance. An embodiment of the present invention which accomplishes the aforementioned advantages is now discussed below.

Figure 9:
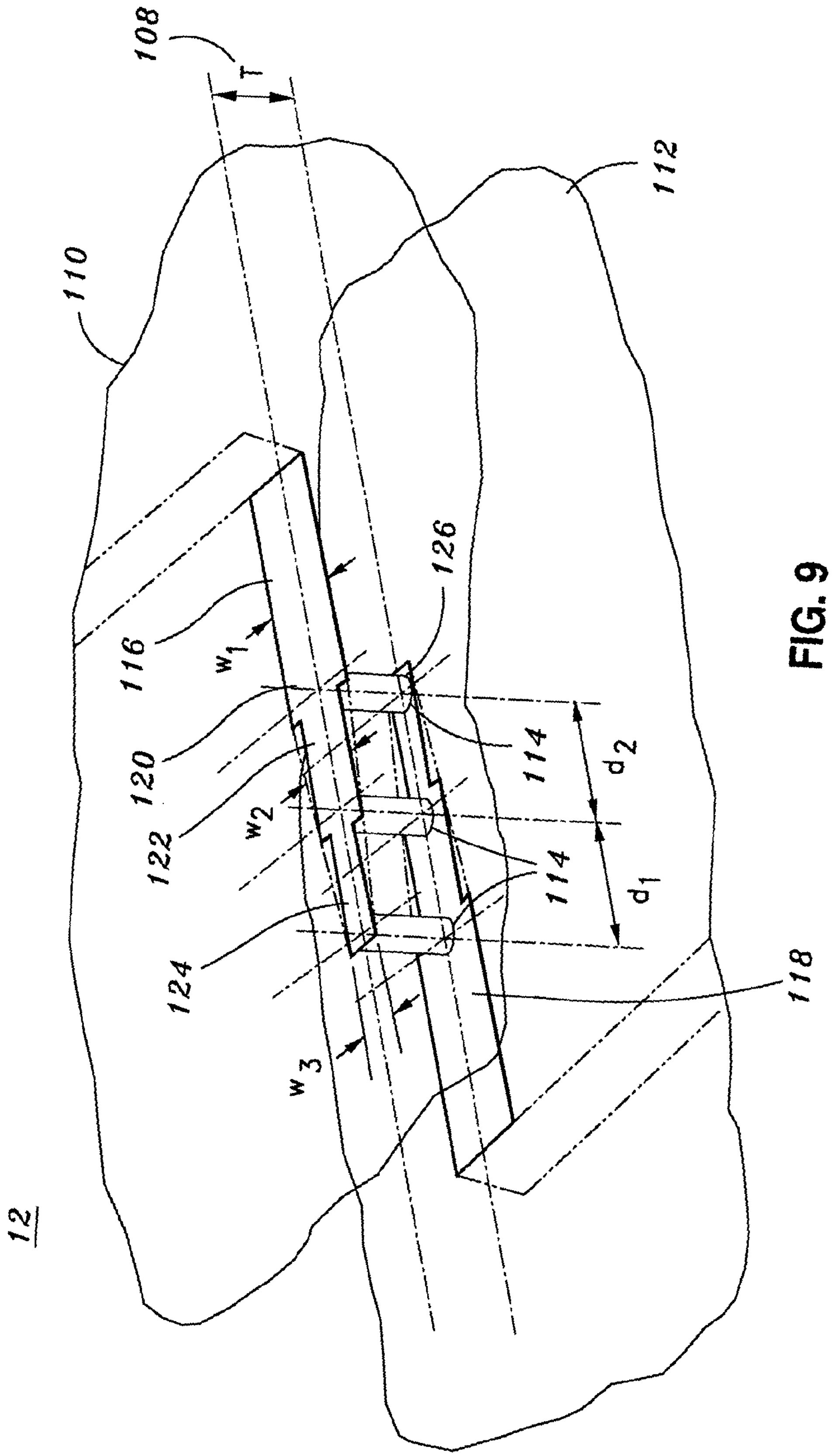
FIG. 9 is a perspective view of a fifth exemplary embodiment of the present invention which utilizes a through-substrate connection.

FIG. 9 is a perspective view of a fifth exemplary embodiment of the present invention which utilizes a distributed interconnect through-substrate connection 12. This embodiment may be utilized in an environment that includes a substrate 108 having a thickness T, and an upper surface 110 and a lower surface 112 which are substantially parallel with each other. A plurality of vias 114 or holes are vertically disposed through the upper and lower surface 110, 112 of the substrate 108. Preferably the vias 114 are equally spaced apart and aligned in a straight line (thus $d_1=d_2$). The vias 114 may be either metal filled or edge-plated. A "dual-stepped" upper trace 116 and dual stepped lower trace 118, are respectively connected (e.g. soldering) to the vias 36. For the instant embodiment, the dual-stepped traces 116, 118 include a first rectangular portion 120 having a width $w_1$, a second rectangular portion 122 having a width $w_2$, and a third rectangular portion 124 having width $w_3$. As is evident in FIG. 9, width $w_1$>width $w_2$>width $w_3$. In the alternative, a dual tapered shaped trace 126 (shown in phantom lines) may be used instead of a stepped configuration. It is also evident, that the distributed through-substrate connection 12 may have numerous other permutations. For instance, the number of vias utilized may vary. Shapes of previously discussed traces, including a tapered trace (see FIG. 2), a stepped trace (see FIG. 5) and a bilateral configuration (see FIG. 7) may also be utilized in the instant embodiment.

Distributed Interconnect for High Performance Microwave/millimeter-wave Packages (Sixth Embodiment)

Moreover, the performance of high-frequency electrical packages often suffers due to feedthrough inductance limitations. By connecting several such inductances in the configuration of a distributed interconnect, such a package is enabled to be used at higher frequencies than previously possible. This in turn, allows microwave board-level products to be manufactured using inexpensive surface-mount technology, which is presently limited to lower frequencies (lower as in "RF" as opposed to "microwave" or "millimeter-wave" frequency bands). One such embodiment is now discussed below.

Figure 10:
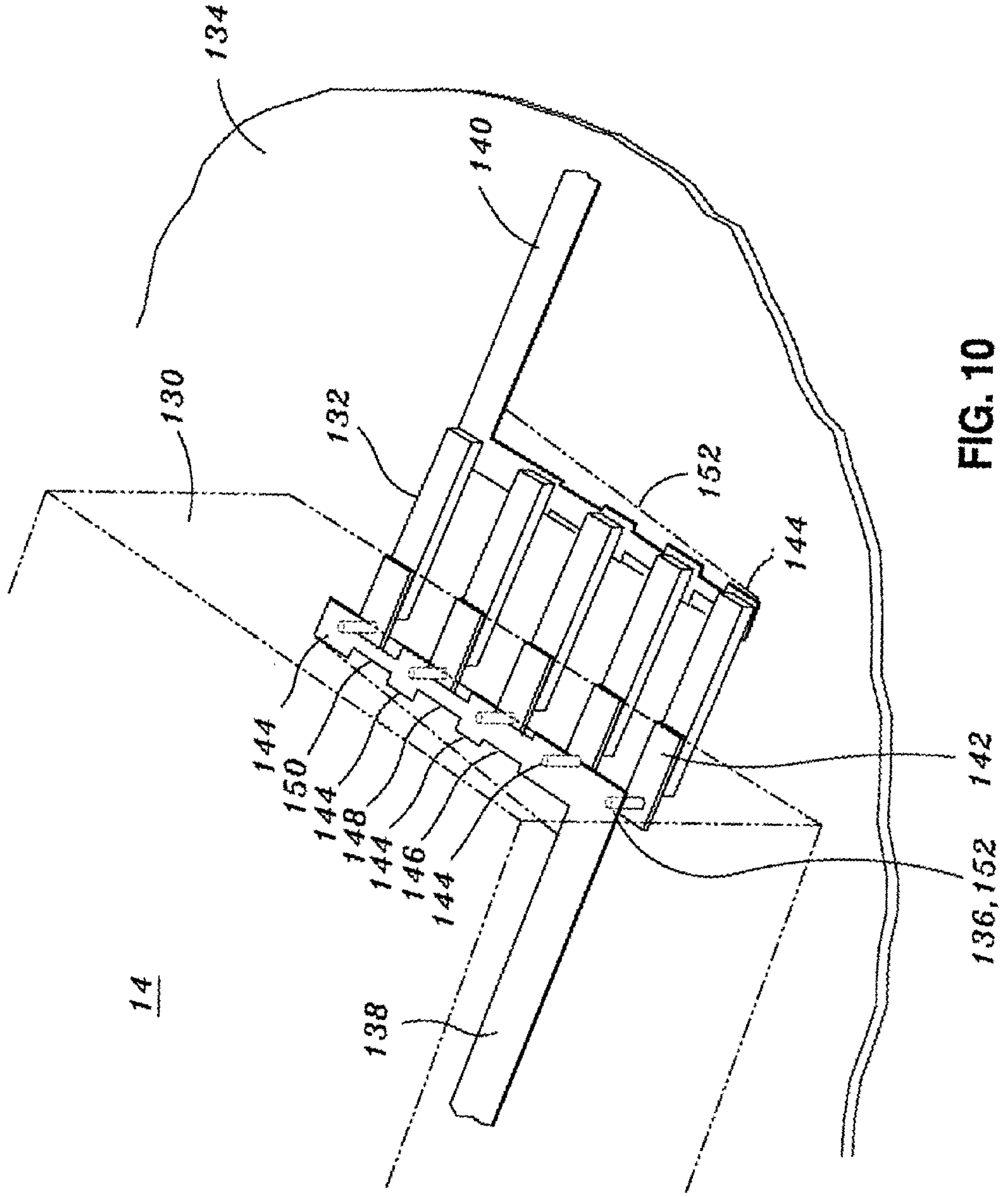
FIG. 10 is a perspective view of a sixth exemplary embodiment of the present invention which incorporates a distributed interconnect for high performance microwave/millimeter-wave packages.

FIG. 10 is a perspective view of a sixth exemplary embodiment of the present invention which is a distributed interconnect for high performance microwave/millimeter-wave packages 14. As discussed, this embodiment of a distributed interconnect is partially enclosed in a semiconductor package 130 and exposed partially on an external surface of a substrate 134. Disposed internally in the package 130 is an input/output (I/O) lead 138 which connects to a device or die inside the package 130. The I/O lead 138 utilizes a "stacked pillar shape". In particular, each via 136 is provided with a pad area 144 having common area dimension. Between each pad 144 area is a connecting pillar 146, 148, 150. It is noted that between the first via 152 and the second via, the connecting pillar is essentially the same width as the I/O lead 138 and pads 144. Between the second and third vias, the width of connecting pillar 146 is decreased. And between the third and fourth vias, the width of connecting pillar 148 decreases another increment. Similarly, the width of connecting pillar 150 is decreased another increment. Therefore, the width of pillar 146 is greater than the width of pillar 148 and the width of pillar 148 is greater than pillar 150. Each lower end of the plurality of vias 136 is conductively attached to a respective transmission element 142 which may have various embodiments known in the art. The opposing ends of each transmission element 142 are bonded to respective external leads 132 which are oriented in parallel with respect to each other and normal to I/O lead 138. The opposing ends of the external leads 132 are bonded to pads 144 of a similar external I/O lead 140, which may be a trace having the same shape as I/O lead 138. It is noted that a multitude of embodiments of the distributed interconnect for high performance microwave/millimeter-wave packages 14 may exist and the embodiment in FIG. 10 is provided as an example and not intended to be limiting. For instance, the shape of I/O leads 138, 140 may have a tapered shape 152 as shown in FIG. 10 (shown in phantom lines). Furthermore, the transmission media between the vias 136 and the external I/O lead 140 may be accomplished in a variety of forms known to those skilled in the art.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather, the invention extends to all functionally equivalent structures, methods, and such uses are within the scope of the appended claims.

What is claimed is:

1. A distributed interconnect between two separate substrates comprising:

a first conductive transmission element formed from a first tapered trace disposed on a first substrate, said first trace having at least a first and second terminal and having an impedance characteristic that linearly increases from said first terminal to said second terminal;

a second conductive transmission element formed from a second tapered trace disposed on a second substrate, said second trace having at least a third and fourth terminal and having an impedance characteristic that linearly increases from said third terminal to said fourth terminal;

a plurality of conductive interconnect elements interconnecting said first and second transmission elements-and at least interconnecting said first terminal to said fourth terminal and said second terminal to said third terminal; and a first and second I/O port for outside electrical communication, said first port in communication with said second terminal and said second port in communication with said fourth terminal.

2. The distributed interconnect according to claim 1, wherein said plurality of conductive interconnect elements are evenly spaced and distributed between said first and second terminals and evenly spaced and distributed between said third and fourth terminals.

3. The distributed interconnect according to claim 1, said plurality of conductive interconnect elements comprising equally spaced bondwires spanning the gap in a lateral and parallel orientation with respect to each other.

4. The distributed interconnect according to claim 1, each of said first and second tapered traces comprising a base side, a tapered side having no steps which opposes said base side at an inclined angle, a long side normal to said base side which connects to both said base and a most inclined end of said tapered side, said long side being positioned proximate and outside one of said first or third terminals, and another portion of said first and second trace opposing said long side which interconnects said base side and a most declined end of said tapered side, said portion positioned proximate and outside of said second or fourth terminals and having a width smaller than that of said long side.

5. The distributed interconnect according to claim 4, said plurality of conductive interconnect elements positioned normal to said base sides of said first and second tapered traces and further in lateral and parallel orientation with respect to each other.

6. The distributed interconnect according to claim 4, said first and second ports comprising said portions of said first and second tapered traces which oppose said short sides and which interconnects the base side and the most upwardly inclined end of said tapered side, and of which are positioned proximate and outside said first or third terminals.

7. The distributed interconnect according to claim 4, said base side of said first trace disposed along a first edge of said first substrate, and said base side of said second trace disposed along a second edge of said second substrate, said first and second edges laterally positioned next to each other forming a generally parallel gap therebetween.

8. A distributed interconnect between two separate substrates comprising:

a first substrate;

a second substrate separate from said first substrate;

a first conductive transmission element formed on said first substrate, said first conductive transmission element disposed between a first and second terminal, said first conductive element having an impedance characteristic that increases from said first terminal to said second terminal;

a second conductive transmission element formed on said second substrate, said second conductive transmission element disposed between a third and fourth terminal, said second conductive element having an impedance characteristic that increases from said third terminal to said fourth terminal, said first and second conductive transmission elements being positioned in parallel alignment with respect to each other; and a plurality of conductive interconnect elements interconnecting said first and second transmission elements, said plurality of interconnect elements distributed along said first and second transmission elements and at least interconnecting said first terminal to said fourth terminal and interconnecting said second terminal to said third terminal; and a first and second port, said first port connected to said first terminal and said second port connected to said third terminal.

9. The distributed interconnect according to claim 8, wherein said plurality of conductive interconnect elements includes at least one interconnect element evenly distributed between said first and second terminal and evenly distributed between said third and fourth terminal.

10. The distributed interconnect according to claim 8, wherein the impedance characteristic of said first and second conductive elements increases in a linear manner.

11. The distributed interconnect according to claim 8, said plurality of conductive interconnect elements positioned normal to said first and second transmission elements and in parallel with each other.

12. The distributed interconnect according to claim 11, said plurality of conductive interconnect elements evenly spaced from each other.

13. The distributed interconnect according to claim 8, said first conductive transmission element comprising a first metal trace disposed along a first edge of said first substrate, and said second conductive transmission element comprising a second metal trace disposed along a second edge of said second substrate, said first edges and second edges laterally positioned next to each other forming a parallel gap therebetween.

14. The distributed interconnect according to claim 13, said plurality of conductive interconnect elements comprising equally spaced bondwires spanning the gap in a laterally parallel and equally space configuration.

15. The distributed interconnect according to claim 13, said first and second traces having a tapered shape having no steps.

16. A method for interconnecting electrical components between two separate substrates which minimizes coupling inductance and increases bandwidth, the method comprising:

disposing a first conductive transmission element between a first and second terminal on a first substrate, the first conductive element having an impedance characteristic that increases from the first terminal to the second terminal, disposing a second conductive transmission element between a third and fourth terminal on a second substrate, the second conductive element having an impedance characteristic that increases from said third terminal to the fourth terminal, and positioning the first and second conductive elements in parallel alignment with respect to each other;

interconnecting a plurality of conductive interconnect elements between the first and second transmission elements by, distributing the plurality of interconnect elements along the first and second transmission elements, at least interconnecting the first terminal to the fourth terminal, and at least interconnecting the second terminal to the to the third terminal; and electrically connecting a first port to the first terminal, and electrically connecting a second port to the third terminal.

17. The method according to claim 16, further comprising evenly distributing the plurality of conductive interconnect elements between the first and second terminal and between the third and fourth terminal.

18. The method according to claim 16, further comprising positioning the plurality of conductive interconnect elements normal to the first and second transmission elements and in a lateral and parallel orientation with respect to each other.

19. The method according to claim 16, further comprising increasing the impedance characteristic of the first and second conductive elements in a linear manner.

20. The method according to claim 19, further comprising, forming the first conductive transmission element from a first metal trace, disposing the first metal trace on a first surface and along a first edge of the first substrate, forming the second conductive transmission element from a second metal trace, disposing the second metal trace on a second surface and along a second edge of the second substrate, and positioning the first edges and second edges laterally next to each other to form a parallel gap therebetween.

21. The method according to claim 20, further comprising utilizing equally spaced bondwires spanning the parallel gap as the plurality of conductive interconnect elements.

22. The method according to claim 20, further comprising providing first and second traces which have a tapered shape having no steps.

23. The method according to claim 20, further comprising utilizing equally spaced bondwires spanning the parallel gap as the plurality of conductive interconnect elements.

24. A method for interconnecting electrical components between two substrates which minimizes coupling inductance and increases bandwidth, the method comprising:

disposing a first conductive transmission element formed from a first tapered trace on a first substrate, the first trace having at least a first and second terminal and having an impedance characteristic that increases linearly from the first terminal to the second terminal;

disposing a second conductive transmission element formed from a second tapered trace on a second substrate, the second trace having at least a third and fourth terminal and having an impedance characteristic that increases linearly from the third terminal to the fourth terminal;

interconnecting a plurality of conductive interconnect elements between the first and second transmission elements by, evenly spacing and distributing the plurality of interconnect elements between the first and second terminals and between the third and fourth terminals, at least interconnecting the first terminal to the fourth terminal, and at least interconnecting the second terminal to the to the third terminal;

providing a first I/O port for outside electrical communication positioned proximate and outside the second terminal; and providing a second I/O port for outside electrical communication positioned proximate and outside the fourth terminal.

25. The method according to claim 24, each of the first and second tapered traces comprising a base side, a tapered side having no steps which opposes the base side at an inclined angle, a long side normal to the base side which connects to both of the base and tapered side the long side being positioned proximate and outside one of the first or third terminals, and another portion of said first and second trace opposing the long side which interconnects the base side and a most declined end of said tapered side, the portion positioned proximate and outside the second or fourth terminals and having a width smaller than that of the long side.

26. The method according to claim 25, further comprising positioning the plurality of conductive interconnect elements normal to the base sides of the first and second tapered traces and in a lateral and parallel orientation with respect to each other.

27. The method according to claim 25, further comprising, disposing the base side of the first trace along a first edge of the first substrate;

disposing the base side of the second trace along a second edge of the second substrate; and positioning the first and second edges laterally next to each other to form a parallel gap therebetween.

* * * * *